(12) United States Patent
Hsia et al.

(10) Patent No.: US 6,747,899 B2
(45) Date of Patent: Jun. 8, 2004

(54) METHOD AND APPARATUS FOR MULTIPLE BYTE OR PAGE MODE PROGRAMMING OF A FLASH MEMORY ARRAY

(75) Inventors: Steve K. Hsia, San Jose, CA (US); Kyung Joon Han, Palo Alto, CA (US); Dung Tran, San Jose, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 118 days.

(21) Appl. No.: 10/035,414

(22) Filed: Nov. 8, 2001

(65) Prior Publication Data

US 2002/0167843 A1 Nov. 14, 2002

Related U.S. Application Data

(60) Provisional application No. 60/291,156, filed on May 14, 2001.

(51) Int. Cl.⁷ .............................................. G11C 16/04
(52) U.S. Cl. .......................... 365/185.28; 365/185.18; 365/365.17
(58) Field of Search ...................... 365/185.28, 185.17, 365/185.18, 185.01

(56) References Cited

U.S. PATENT DOCUMENTS

| | | | |
|---|---|---|---|
| 5,060,195 A | 10/1991 | Gill et al. | |
| 5,412,603 A | * 5/1995 | Schreck et al. | 365/189.01 |
| 5,418,741 A | 5/1995 | Gill | |
| 5,457,652 A | * 10/1995 | Brahmbhatt | 365/185.27 |
| 5,487,033 A | 1/1996 | Keeney et al. | |
| 5,546,340 A | 8/1996 | Hu et al. | |
| 5,553,020 A | 9/1996 | Keeney et al. | |
| 5,646,886 A | 7/1997 | Brahmbhatt | |
| 5,659,504 A | 8/1997 | Bude et al. | |
| 5,959,892 A | 9/1999 | Lin et al. | |
| 6,175,519 B1 | 1/2001 | Lu et al. | |

OTHER PUBLICATIONS

J. D. Bude et al.; *Monte Carlo Simulation of the Chisel Flash Memory Cell*; IEEE Transactions on Electron Devices, vol. 47, No. 10, Oct. 2000; pp. 1873–1881.

J.D. Bude et al.; *EEPROM/Flash Sub 5.0V Drain–Source Bias Hot Carrier Writing*, IEDM Technical Digest, 1995, p. 989–991.

J.D. Bude et al.; *Secondary Electron Flash—a High Performance, Low Power Flash Technology for 0.35 μm and Below*; IEDM Technical Digest, 1997, pp. 279–282.

Brown, William D. and Brewer, Joe E., eds., Nonvolatile Semiconductor Memory Technology: A Comprehensive Guide to Understanding and Using NVSM Devices, IEEE Press, New York, 1998, pp. 69, 105, 107–108, 203, 213–217, 226–227, 235, 239–241, 244, 247, 279–281.

\* cited by examiner

*Primary Examiner*—Hoai Ho
(74) *Attorney, Agent, or Firm*—Altera Law Group, LLC (57) ABSTRACT

A memory array contains memory cells designed to be erased using Fowler-Nordheim ("FN") tunneling through the channel area, and programmed using either channel hot electron injection ("CHE") or channel-initiated secondary electron injection ("CISEI"). To reduce disturbance of the floating gate potential of unselected memory cells during programming operations and read operations, the unselected word lines are brought to a negative potential rather than ground potential. To reduce disturbance of the floating gate potential of unselected memory cells during FN erase operations, the unselected word lines are brought to a positive potential rather than ground potential.

11 Claims, 10 Drawing Sheets

| OPERATION | $V_G$ SELECT | $V_G$ UNSEL | $V_S$ | $V_D$ | $V_P$ | $V_{NW}$ | $V_T$ |
|---|---|---|---|---|---|---|---|
| READ | 2.5V TO 3V | -2V | 0V | 1V TO 1.5V | 0V | 0V | |
| PAGE PROGRAM | 7V TO 8V | -2V | 0V | 4V | -2V | 0V | 5.5V |
| PAGE ERASE | -11V | 2.5V TO 3V | F OR 6V | 6V | 6V | 6V | 2V |

| OPERATION | $V_G$ SELECT | $V_G$ UNSEL | $V_S$ | $V_D$ | $V_P$ | $V_{NW}$ | $V_T$ |
|---|---|---|---|---|---|---|---|
| READ | 2.5V TO 3V | -2V | 0V | 1V TO 1.5V | 0V | 0V | |
| PAGE PROGRAM | 7V TO 8V | -2V | 0V | 4V | -2V | 0V | 5.5V |
| PAGE ERASE | -11V | 2.5V TO 3V | F OR 6V | 6V | 6V | 6V | 2V |

METHOD AND APPARATUS FOR MULTIPLE BYTE OR PAGE MODE PROGRAMMING OF A FLASH MEMORY ARRAY

CROSS-REFERENCE TO RELATED APPLICATION

This application claims the benefit of U.S. Provisional Patent Application No. 60/291,156, filed May 14, 2001 (Hsia et al., "Apparatus and method for multiple byte or page mode programming or erasure in a nonvolatile flash memory array," which is hereby incorporated herein by reference in its entirety.

BACKGROUND OF THE INVENTION

1. Field of the Invention

The present invention relates to semiconductor memory, and more particularly to nonvolatile semiconductor memory that is programmable as well as erasable.

2. Description of the Related Art

Nonvolatile memory retains stored data when power is removed, which is required or at least highly desirable in many different types of computers and other electronic devices. Some types of nonvolatile memory are capable of being repeatedly programmed and erased, including erasable programmable read only semiconductor memory generally known as EPROM, and electrically erasable programmable read only semiconductor memory generally known as EEPROM. EPROM memory is erased by application of ultraviolet light and programmed by application of various voltages, while EEPROM memory is both erased and programmed by application of various voltages. EPROMs and EEPROMs have suitable structures, generally known as floating gates, that are charged or discharged in accordance with data to be stored thereon. The charge on the floating gate establishes the threshold voltage, or $V_T$, of the device, which is sensed when the memory is read to determine the data stored therein.

Figure 1:
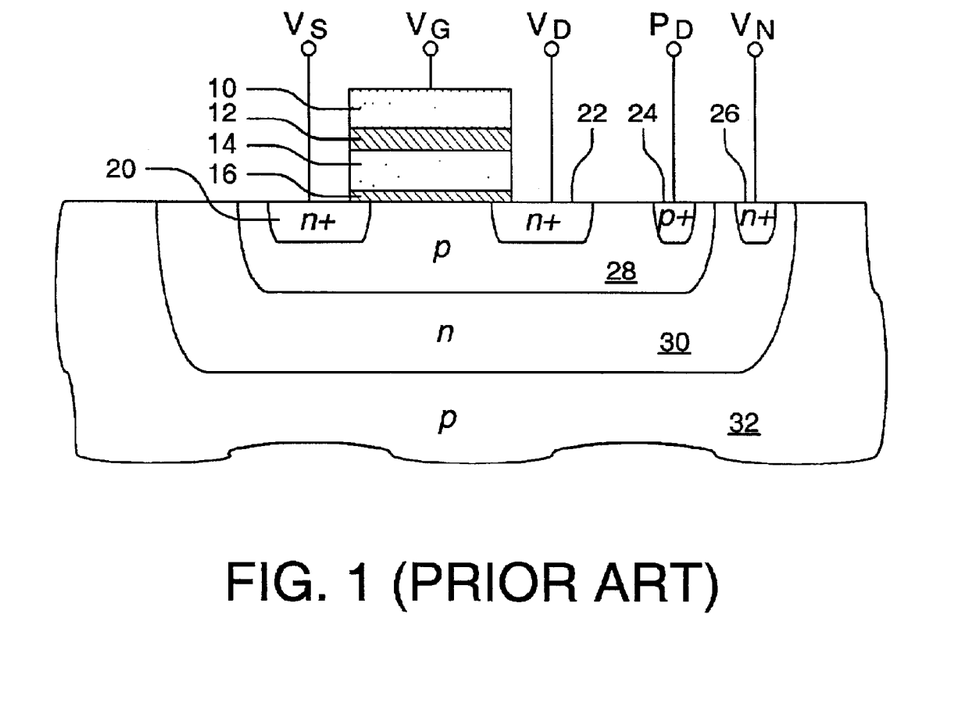
FIG. 1 is a cross-section drawing of a stacked gate EEPROM cell of the prior art.

An illustrative well known type of compact floating gate EEPROM cell structure is the stacked gate structure shown in FIG. 1. A floating gate 14, typically a doped polysilicon layer, is sandwiched between two insulator layers 12 and 16, typically oxide. The top layer of the stack is a control gate electrode 10, typically a doped polysilicon layer. The stacked gate structure is shown symmetrically overlying part of a heavily doped n+ source region 20 and a heavily doped n+ drain region 22, as well as a channel region between the source region 20 and the drain region 22. The channel region is part of a p-well 28, which also contains the source region 20, the drain region 22, and a heavily p+ doped contact region 24. The p-well 28 typically is contained within an n-type substrate or within an n-well such as shown at 30, which also contains a heavily n+ doped contact region 26. The n-well 30 is in turn contained in the p-type substrate 32. Many variations in the floating gate EEPROM cell structure are known, and include asymmetrical stacked gate structures, split gate structures, and so forth. Moreover, although the structure of FIG. 1 is an n-channel enhancement mode device, nonvolatile memory cells may be fabricated as either n-channel or p-channel devices or as enhancement or depletion mode devices.

As is typical of nonvolatile memory cells that are capable of being repeatedly programmed and erased, the various functions of the EEPROM stacked gate memory cell of FIG. 1 are controlled by applying various bias voltages. The voltage applied to the control gate is $V_G$, the voltage applied to the source is $V_S$, the voltage applied to the drain is $V_D$, the voltage applied to the p-well 28 is $V_P$, the voltage applied to the n-well 30 is $V_N$, and the voltage applied to the p-type substrate 32 is $V_B$ (not shown). Typically the substrate 32 is grounded, i.e. $V_B=0V$. Typically writing or programming the memory cell means adding negative charge to the floating gate while erasing the memory cell means removing negative charge from the floating gate, but the charged state can be considered the erased state if desired. Other voltages are applied to read the charge state of the memory cell by detecting the threshold voltage $V_T$ of the memory cell, which ideally is done without disturbing the charge state.

Depending to some extent on device characteristics, the stacked gate transistor of FIG. 1 may be programmed by moving electrons to the floating gate 16 using Fowler-Nordheim ("FN") tunneling or electron injection. Electron injection typically is done using channel hot electron injection ("CHE") or channel-initiated secondary electron injection ("CISEI"). CISEI is also known as substrate bias enhanced hot electron injection.

Figure 2:
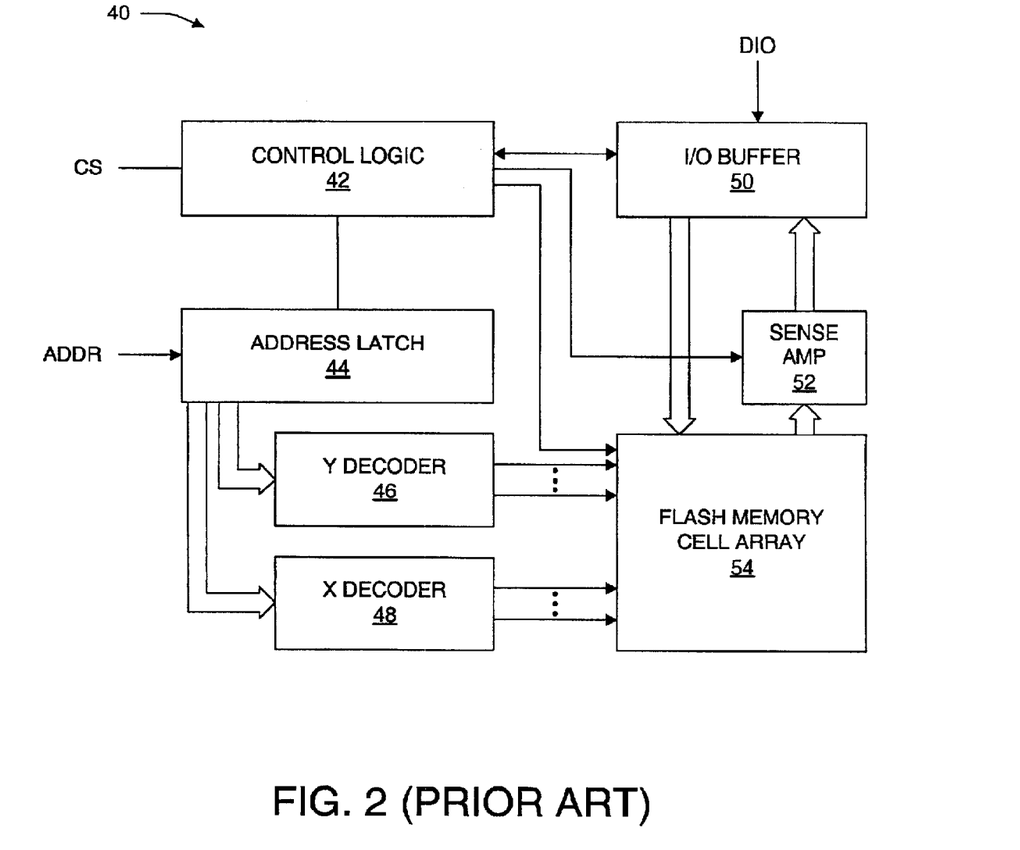
FIG. 2 is a schematic block diagram of a memory device of the prior art.

The EEPROM stacked gate memory cell of FIG. 1 may be used in a variety of memory array architectures, including common ground arrays as well as virtual ground arrays. A memory is formed by combining a memory array with well known circuitry such as control logic, address decoders, sense amplifiers, and power supplies. An example of a memory 40 having an flash memory array 54 of such individual cells is shown in FIG. 2. Various read, erase and program voltages are furnished by suitable power supplies (not shown). A serial memory address ADDR is latched into an address latch 44, decoded for its row and column information (X and Y) by X decoder 48 and Y decoder 46, and applied to the memory array 54 to access the selected row and column. If the operation is a program operation, the data to be written is temporarily stored in I/O buffer 50 as it is written to the memory array 54. If the operation is a read, the selected bits are sensed by sense amplifier 52 and then temporarily stored in the I/O buffer 50, where they are accessible to external circuits.

For many memory applications, one desires to read and program multiple bytes of the memory array 54 simultaneously, or even an entire page of the memory array 54. Similarly, one may desire to erase multiple bytes or even an entire page of the memory array 54 at one time, or even multiple pages or the entire memory. To facilitate erasing, programming and reading multiple bytes or even an entire page, each row of the memory array or perhaps adjacent rows may correspond to a page of memory. A sector of memory may contain several pages. Such memory is known as "flash" memory because of the large number of bits that can be erased or programmed simultaneously.

One type of conventional flash memory uses FN tunneling for both erasure and programming. Unfortunately, programming using FN tunneling from the drain edge to the floating gate is relatively slow. Transistors using FN programming generally requires a longer channel length, leading to larger cell size. FN programmed memories also require bit-latch circuitry, which increases the size of the memory chip.

Another type of conventional flash memory uses CHE for programming. CHE programming is fast relative to FN programming. Unfortunately, the high drain voltage and programming current required by CHE renders the technique disadvantageous for use in low power applications, and severely limits the number of bits that can be programmed at one time. Simultaneous multiple byte programming is difficult to perform, as a practical matter.

While multiple byte programming and page mode programming of a CHE type memory can be achieved by repeated programming groups of bits until the desired amount of memory is programmed, the approach can result in an unfavorable condition known as program-disturb. Program-disturb is related to the voltage conditions that occur in the part of the memory that is not being programmed while another part of the memory is being programmed. These voltage conditions cause multiple minute shifts in the threshold voltage of the memory cells that are not being programmed, which occur as other parts of the memory are being programmed. A similar problem occurs during read-out of data. Read voltages applied to the non-volatile cells, including both the addressed cells and some of the cells that are not addressed, can induce a threshold voltage shift in these cells. While program-disturb and read-disturb can be avoided by the use of an isolating select transistor in each memory cell, such transistors are undesirable insofar as they cause an increase in the size of the memory cell and a corresponding decrease in the memory array density.

A technique is known that uses negative substrate biasing of the flash memory cells to overcome some of the disadvantages of conventional CHE. An example of this technique is disclosed in U.S. Pat. No. 5,659,504, which issued Aug. 19, 1997, to Bude et al. and is entitled "Method and Apparatus for Hot Carrier Injection." The Bude et al. programming technique, which is referred to as channel-initiated secondary electron injection ("CISEI"), uses a positive bias voltage of about 1.1 volts to about 3.3 volts at the drain and a negative bias voltage of about −0.5 volts or more negative at the substrate, with the source at zero volts. The source-drain voltage causes some channel hot electron generation while the substrate bias promotes the generation of a sufficient amount of secondary hot electrons having a sufficient amount of energy to overcome the energy barrier between the substrate and the floating gate. The secondary hot electrons are primarily involved in charging the floating gate. The programming of the flash memory array using CISEI transistors is relatively quickly achieved with low programming current, low drain voltage, and smaller cell size (shorter channel length) relative to flash memory arrays using CHE transistors. However, simultaneous multiple byte programming and page mode programming are still difficult to achieve. Unfortunately, as in the case the CHE memory array, the use of isolating select transistors in CISEI memory cells increases their size, and the technique of repeated programming groups of bits until the desired amount of memory is programmed can cause program-disturb.

While CHE and CISEI cell programming is faster that FN cell programming, multiple byte programming and page mode programming of CHE and CISEI memory arrays remains problematical. FN tunneling remains a popular choice in flash memory for erase operations.

BRIEF SUMMARY OF THE INVENTION

We have found that flash memory that uses negative substrate biasing to obtain channel-initiated secondary electron injection into the floating gate during programming suffers disturbance of the floating gate potential especially during page mode programming operations, and may also suffer disturbance of the floating gate potential during read operations. We have also found that the relatively thin high quality tunnel oxide commonly found in EEPROM memory cells has a shortened lifetime because of the high fields that occur across the tunnel oxide during the FN erase operations.

These and other disadvantages are overcome individually or collectively in various embodiments of the present invention. For example, one embodiment of the present invention is a memory having a memory array that is programmed using negative substrate bias, and further having a voltage source for placing a negative bias on control gates of unselected memory cells subject to program-disturb to reduce the effect.

Another embodiment of the present invention is a method of programming a memory array that comprises a plurality of memory cells coupled to a plurality of word select lines, each of the memory cells having an adjustable threshold voltage and a gate overlying a channel and being programmable using channel-initiated secondary electron injection. The method comprises applying a first negative voltage to the channels; establishing a voltage differential across the respective channels of at least a first and a second of the memory cells, the potential differential being sufficient to generate channel-initiated secondary hot electrons in the respective channels thereof; applying a second voltage to the gate of the first memory cell, the second voltage having a polarity and magnitude relative to the first voltage sufficient to attract the hot electrons and change the threshold voltage of the first memory cell to a programmed state; and applying a third voltage to the gate of the second memory cell, the third voltage having a polarity and magnitude relative to the first voltage sufficient to repel the hot electrons and deter change in the threshold voltage of the second memory cell.

Yet another embodiment of the present invention is a NOR-type memory integrated circuit comprising a plurality of word select lines; a plurality of bit lines; a plurality of source lines; a memory array having a plurality of adjustable threshold voltage memory transistors, each being programmable using channel-initiated secondary electron injection and having a source coupled to one of the source lines, a drain coupled to one of the bit lines, a floating gate overlying a channel defined in a substrate body region between the source and the drain, and a control gate overlying the floating gate and coupled to one of the word select lines; a voltage source for applying a body voltage to the substrate body regions containing the channels; a voltage source for applying a source voltage to the sources of at least a first and a second of the memory transistors via a common one of the source lines; a voltage source for applying a drain programming voltage to the drains of the first and second memory transistors via a common one of the column lines, the source and drain programming voltages being sufficient to generate channel-initiated secondary hot electrons in the respective channels of the first and second memory transistors; a voltage source for applying a select voltage to the gate of the first memory transistor via a first one of the word select lines, the select voltage having a polarity and magnitude relative to the body voltage sufficient to attract the hot electrons of the first memory transistor and change the threshold voltage thereof to a programmed state; and a voltage source for applying an unselect voltage to the gate of the second memory cell via a second one of the word select lines, the unselect voltage having a polarity and magnitude relative to the first voltage sufficient to repel the hot electrons of the second memory transistor and deter change in the threshold voltage thereof.

Yet another embodiment of the present invention is a virtual ground-type memory integrated circuit comprising a plurality of word select lines; a plurality of column lines; a memory array having a plurality of adjustable threshold voltage memory transistors, each being programmable using channel-initiated secondary electron injection and having a source coupled to one of the column lines, a drain coupled to an adjacent one of the column lines, a floating gate overlying a channel defined in a substrate body region between the source and the drain, and a control gate overlying the floating gate and coupled to one of the word select lines; a voltage source for applying a body voltage to the substrate body regions containing the channels; a voltage source for applying a reference voltage to the sources of at least a first and a second of the memory transistors via a first one of the column lines; a voltage source for applying a programming voltage to the drains of the first and second memory transistors via a second one of the column lines adjacent the first column line, the reference and programming voltages being sufficient to generate channel-initiated secondary hot electrons in the respective channels of the first and second memory transistors; a voltage source for applying a select voltage to the gate of the first memory transistor via a first one of the word select lines, the select voltage having a polarity and magnitude relative to the body voltage sufficient to attract the hot electrons of the first memory transistor and change the threshold voltage thereof to a programmed state; and a voltage source for applying an unselect voltage to the gate of the second memory cell via a second one of the word select lines, the unselect voltage having a polarity and magnitude relative to the first voltage sufficient to repel the hot electrons of the second memory transistor and deter change in the threshold voltage thereof.

DETAILED DESCRIPTION OF THE INVENTION INCLUDING THE PREFERRED EMBODIMENT

EEPROM cells of the stacked gate type shown in FIG. 1 are used in a variety of different types of flash array architectures where they are subject to disturbance of the floating gate potential during CISEI page mode programming operations, and may also suffer disturbance of the floating gate potential during read operations.

Figure 3:
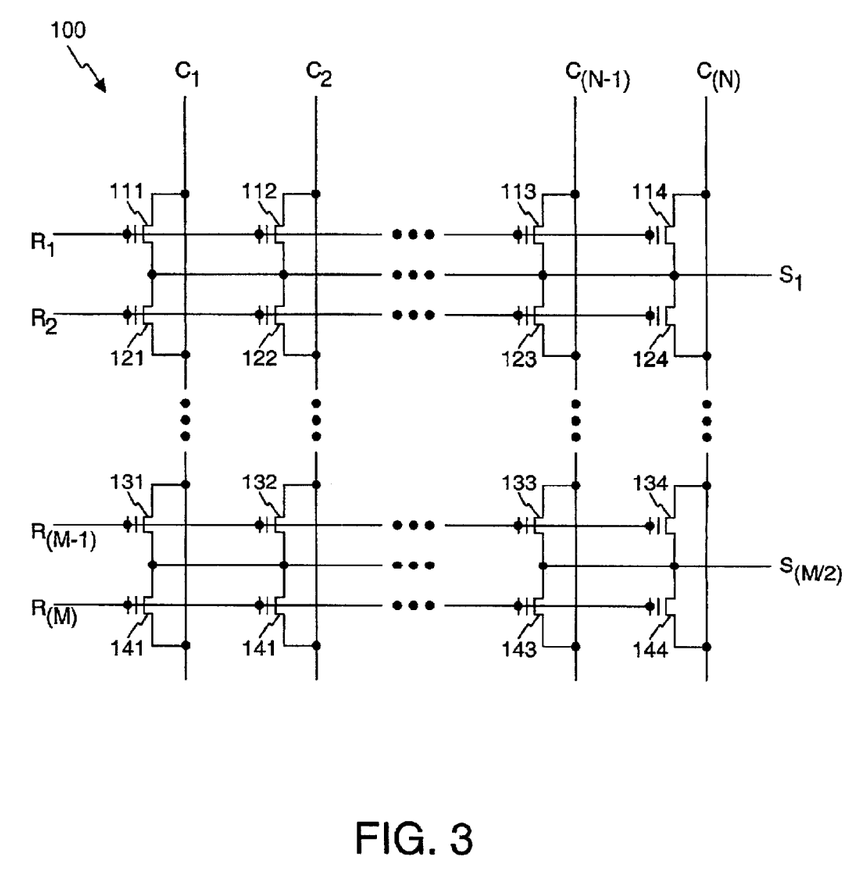
FIG. 3 is a schematic circuit diagram of common ground NOR array of memory cells.

A common ground NOR array 100 is shown in FIG. 3. Simplified for clarity, the array 100 illustratively is arranged in M rows and N columns of memory cells, and each individual memory cell 111–114, 121–124, 131–134 and 141–144 is a stacked gate type of cell such as that shown in FIG. 1 but preferably having a halo implant in a manner well known in the art. While a variety of other type of nonvolatile memory cells using floating gates and other classes of nonvolatile memory cells using charge trapping like the MNOS (Metal-Nitride-Oxide-Semiconductor) device to set the threshold voltage $V_T$ of the cell may also be used, the use of the stacked gate type cell permits the memory array 100 to have a high integration density. Indeed, the integration density of flash EEPROM memory using the stacked gate structure is quite large, even in a NOR memory architecture. For example, memory fabricated using 0.18 $\mu$m processes can have storage capacity as large as 128 megabits, with a single row having as many as 5000 memory cells.

In the illustrative memory array 100, the memory cells reside at respective row-column cross points and large groups of the memory cells share common source lines. The row lines $R_1$, $R_2$, ..., $R_{(M-1)}$ and $R_M$ are the word lines of the memory array 100, and the column lines $C_1$, $C_2$, ..., $C_{(N-1)}$ and $C_N$ are the bit lines of the memory array 100. Word line $R_1$ is connected to the control gates of transistors 111, 112, 113 and 114. Similarly, word line $R_2$ is connected to the control gates of transistors 121, 122, 123 and 124; word line $R_{(M-1)}$ is connected to the control gates of transistors 131, 132, 133 and 134; and word line $R_M$ is connected to the control gates of transistors 141, 142, 143 and 144. Column line $C_1$ is connected to the drains of transistors 111, 121, 131 and 141. Similarly, column line $C_2$ is connected to the drains of transistors 112, 122, 132 and 142; column line $C_{(N-1)}$ is connected to the drains of transistors 113, 123, 133 and 143; and column line $C_{(N)}$ is connected to the drains of transistors 114, 124, 134 and 144. Additional operating voltage is brought to groups of the memory cells on the source lines $S_1$, and $S_{(M/2)}$, which are connected to the sources of, respectively, transistors 111–114 and 121–124, and transistors 131–134 and 141–144. The source lines $S_1$ and $S_{(M/2)}$ may be commonly connected, connected in groups, or individually controllable, as desired. For purposes of clarity, a page of the memory array 100 is considered a row of memory cells, although a page may be differently defined for other memory array architectures. For purposes of clarity, the sector aspect of the architecture is not shown, although a sector illustratively has 32, 64 or more word lines. Illustratively, the memory array 100 has a storage capacity in the range of 16 to 128 Mb, with a single row having as many as 2 K, 4 K or even 8 K memory cells. It will be appreciated that more complex arrangements such as sub-bit lines and substrate block isolation may be used as desired to enhance certain aspects of the memory, in a manner well known in the art.

A great many array architectures and nonvolatile semiconductor memory devices have been developed based on virtual ground contactless array architecture that can achieve even higher memory density levels than the NOR array, as exemplified by the following patents: U.S. Pat. No. 6,175,519, issued Jan. 16, 2001 to Lu et al.; U.S. Pat. No. 5,959,892, issued Sep. 28, 1999 to Lin et al.; U.S. Pat. No. 5,646,886, issued Jul. 8, 1997 to Brahmbhatt; U.S. Pat. No. 5,418,741, issued May 23, 1995 to Gill; and U.S. Pat. No. 5,060,195, issued Oct. 22, 1991 to Gill et al.

Figure 4:
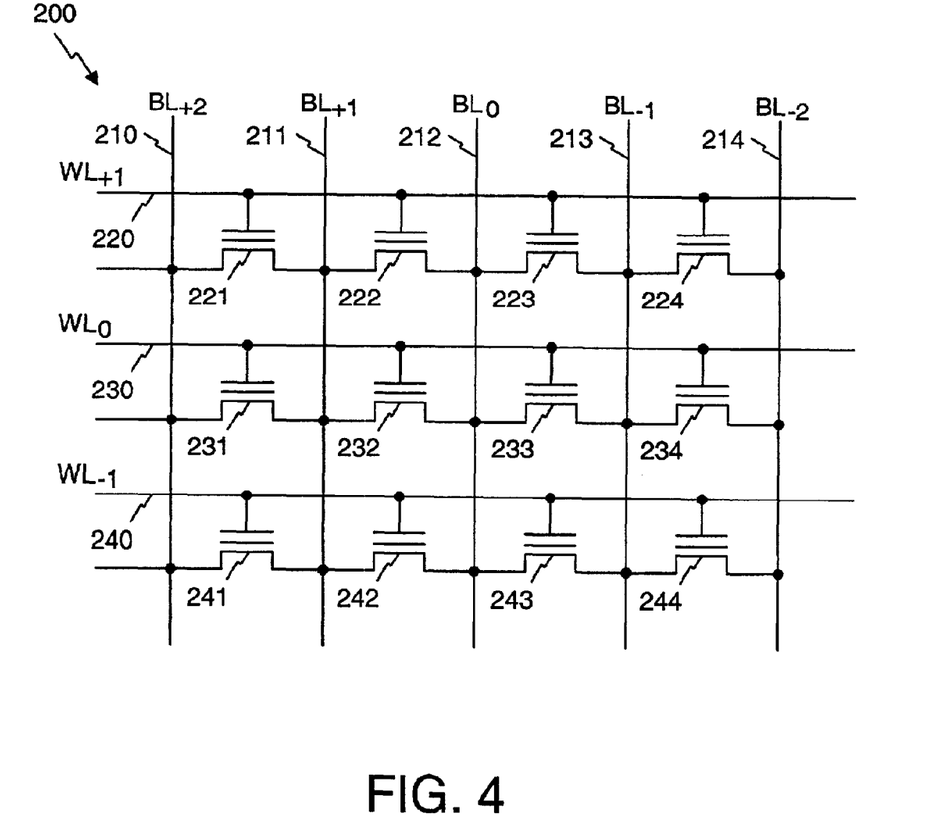
FIG. 4 is a schematic circuit diagram of a virtual ground array of memory cells.

FIG. 4 shows a portion of the core of a simple virtual ground contactless array architecture 200 that uses a cross-point array configuration defined by, illustratively, buried n+ diffusions 210, 211, 212, 213 and 214 that form the bit lines and source lines $BL_{+2}$, $BL_{+1}$, $BL_0$, $BL_{-1}$, and $BL_{-2}$, and $WSi_2$/Poly control gate wordlines 220, 230 and 240, or $WL_{+1}$, $WL_0$ and $WL_{-1}$. Due to elimination of the common ground line and the drain contact in each memory cell, extremely small cell size is realized. Programming, erasing and reading of the memory cells is obtained by the use of asymmetrical CISEI-programmed floating gate transistors 221–224, 231–234, and 241–244, and suitable source and drain decoding. Various well know measures may be taken to improve performance, such as the use of metal lines to periodically connect to the bit lines to reduce bit line resistance, the use of block select transistors to control the various voltages on segmented bit lines, and so forth.

In practice, memory arrays such as the arrays 100 and 200 are organized into bytes and pages and redundant rows (not shown), which may be done in any desired manner. Complete memories include well known elements such as sense amplifiers, pull-up circuits, word line amplifiers, sense amplifiers, decoders, and voltage circuits, which are omitted from FIGS. 3 and 4 for clarity.

A variety of processes for fabricating arrays of memory cells, including halo-implanted stacked gate cells, are well known in the art. For example, one suitable process for fabricating a NOR array of stacked gate cells such as shown in FIG. 1 is the ETOX™ memory technology, which is widely described in the literature, including various publications of Intel Corporation of Santa Clara, Calif., and which is available as a fabrication service from various semiconductor device manufacturers. Virtual ground processes are widely described in the literature and are available as fabrication services from various semiconductor device manufacturers, including National Semiconductor Corporation of Santa Clara, Calif., and Macronix International Co., Ltd. of Hsinchu, Taiwan.

Preferably, the memory cells in the illustrative arrays 100 and 200 are designed to be erased using Fowler-Nordheim ("FN") tunneling, and programmed using channel-initiated secondary electron injection ("CISEI"). Advantageously, the use of CISEI programming allows a shorter channel length, which enables a smaller cell size. Advantageously, CISEI programming is significantly faster on a single cell basis than FN tunneling. Advantageously, the use of FN tunneling through the channel area for erase allows single or multiple pages to be erased with low relatively low power. An illustrative stacked gate halo-implanted transistor for the memory arrays 100 and 200 has the following exemplary basic characteristics: a grown tunnel oxide having a thickness of about 9 nm to 10 nm, an oxide-nitride-oxide ("ONO") insulator between the control gate and the floating gate having an effective thickness of about 14 nm to 16 nm, a phosphorus doped polysilicon floating gate having a thickness of about 160 nm, a p-well peak doping and depth of about $8 \times 10^{17}$ cm$^{-3}$ and 1.8 μm respectively, an n-well peak doping and depth of about $1 \times 10^{17}$ cm$^3$ and 4 μm respectively, source and drain peak doping and depth of about $1 \times 10^{21}$ cm$^3$ and 0.15 μm respectively, a p-type halo implant of Boron under the condition of 25 KeV, $5 \times 10^{13}$ cm$^{-3}$, a 15° tilt, and quad rotation, a channel width in the range of 0.15 μm to 0.25 μm, and a channel length in the range of 0.25 μm to 0.35 μm. It will be appreciated that these characteristics are illustrative, and may vary depending on the application and the fabrication process. In particular, transistors designed for CISEI programming are optimized in various ways know in the art, such as by using thin oxides, heavily doped junctions, and shallow junctions; see, e.g., J. D. Bude et al., EEPROM/Flash Sub 5.0V Drain-Source Bias Hot Carrier Writing, IEDM Technical Digest, 1995, p. 989–991.

Memory array programming operations for CISEI-programmed serial flash memory may be performed on successive sets of multiple bits, and preferably on a multiple byte basis with all the bits of multiple bytes being programmed simultaneously, and an entire pate of memory being programmed in successive groups of bytes. Memory array erase operations preferably are performed on multiple pages, one or more selected sectors, or the entire memory array. The selected memory cells for these memory operations are accessed by placing appropriate voltages on the word, bit and source lines of the selected memory cells, as well as on the diffusion wells in which the selected memory cells reside. The non-selected cells have different combinations of voltages, including in some cases word, bit and source lines that are brought to ground potential or left floating, which prevent the operation from occurring on them.

Consider, for example, the NOR array 100. All of the transistors 111–114 are erased simultaneously by placing an erase select voltage on the word line $R_1$, an erase support voltage on all of the column lines $C_1$, $C_2$, $C_{(N-1)}$ and $C_N$, and an erase support voltage on the p-well in which the channel is formed. Any suitable technique may be used for erase convergence. If for purposes of illustration one does not wish to erase the transistors 121–124, 131–134 and 141–144, the word lines are brought to ground potential. As another example, the transistors 111–114 are selected for programming by placing a program select voltage on the word line $R_1$, and grounding the source line $S_1$. The column lines $C_1$, $C_2$, $C_{(N-1)}$ and $C_N$, carry a program support voltage or ground potential, depending on the data to be programmed into the memory array 100. If for purposes of illustration one does not wish to program the transistors 121–124, 131–134 and 141–144, the word lines $R_2$, . . . , $R_{(M-1)}$ and $R_M$ would normally be brought to ground potential. It will be appreciated that the voltage levels depend on not only the type of memory cell, but also on the specific characteristics of the stacked gate memory cell. For example, a reduction in the oxide thickness between the floating gate and the channel permits reductions in the source-drain voltage.

As another example, consider the virtual ground array 200. Access to individual memory cells on a selected word line for reading and programming is obtained by applying appropriate voltages to the bit lines to avoid disturbing the threshold voltage of the cell adjacent to and on the same word line with the cell being read or programmed, in a manner well known in the art. For example, memory cell 232 is accessed for reading or programming by bringing the word line 230 high, the bit line 211 ($BL_{+1}$) high, and the bit line 212 ($BL_0$) low. Disturbance of the threshold voltage of the adjacent cells 231 and 233 is avoided by bringing the bit line 210 ($BL_{+2}$) high and the bit line 213 ($BL_0$) low.

Generally, the voltages used for CISEI cells are lower than the voltages used in conventional CHE cells. The channel current is sustained in each cell to be programmed by bring its source to ground potential and its drain to a program support voltage of less than about a positive 4 volts. Sufficient hot electron injection is realized by applying a negative bias to the substrate of less than about 3 volts (absolute value) and preferably between about minus 2.5 and minus 1.5 volts. The voltage levels are suitable for the stacked gate structure of FIG. 1 having a halo implant in a manner well known in the art, although it will be appreciated that the voltage levels depend on not only the type of memory cell, but also specific characteristics of the stacked gate memory cell. For example, a reduction in the oxide thickness between the floating gate and the channel permits reduction in the negative substrate bias as well as reductions in the source-drain voltage. In an event, relatively fast programming (about 10 $\mu$sec or less to reach a high $V_T$ of 5.5V) can be achieved with low programming current (about 110 $\mu$A or less per cell), thereby making feasible simultaneous multiple byte program operation for page mode flash memory as well as non-page mode flash memory.

We have found that flash memory that uses CISEI for programming multiple bytes and entire pages suffers disturbance of the floating gate potential during programming operations in the memory cells controlled by the unselected word lines and sharing the same bit line or bit lines as the cell or cells being programmed. Memory cells in the memory arrays 100 and 200 are impressed with four different sets of voltages during programming, two sets being impressed on the selected cells depending on the whether data is being programmed therein, and the other two sets being impressed on unselected cells depending on their location in the memory array. These various sets of voltages are illustrated in FIG. 5, FIG. 6, FIG. 7 and FIG. 8 for the NOR memory array 100, but are applicable in principle to other types of arrays such as the virtual ground array 200.

Figure 5:
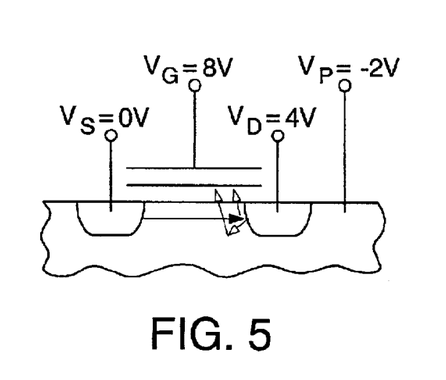
FIGS. 5–10 are cross-section drawings of an EEPROM cell suitable for CISEI programming, as exposed to various CISEI programming bias voltages.

FIG. 5 shows illustrative voltages on a selected memory transistor that is being programmed: the gate voltage $V_G$=8V, the source voltage $V_S$=0V, the drain voltage $V_D$=4V and the p-well substrate voltage $V_P$=-2V. Majority carriers flow in the channel, as indicated by the arrow with the black arrowhead. Additionally, channel hot electrons and secondary hot electrons are generated and injected into the floating gate, as indicated by the arrows with the white arrowheads. The resulting threshold voltage is illustratively $V_T$=5.5V. This is a satisfactory condition.

Figure 6:
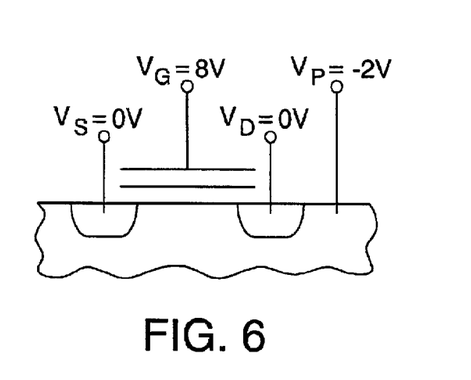

FIG. 6 shows illustrative voltages on a selected memory transistor that is not being programmed: the gate voltage $V_G$=8V, the source voltage $V_S$=0V, the drain voltage $V_D$=0V and the p-well substrate voltage $V_P$=-2V. A similar condition exists in the virtual ground array 300, except that the source and drain of the memory cell adjacent the memory cell being programmed are pulled up. No channel current flows, and no channel hot electrons or secondary hot electrons are generated. This is a satisfactory condition.

Figure 7:
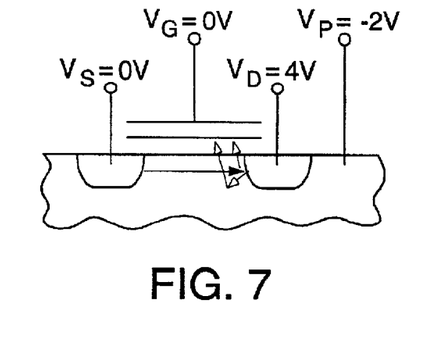

FIG. 7 shows illustrative voltages on a non-selected memory transistor that shares a bit line with a selected memory transistor that is being programmed: the gate voltage $V_G$=0V, the source voltage $V_S$=0V, the drain voltage $V_D$=4V, and the p-well substrate voltage $V_P$=-2V. Some majority carrier flow exists in the channel, as indicated by the arrow with the black arrowhead. Channel hot electrons and secondary hot electrons are generated, as indicated by the arrows with the white arrowheads. Since the control gate is at zero potential, it does not attract the hot electrons. However, some of the hot electrons will nonetheless become injected into the floating gate after a prolonged time, thereby disturbing the erased state of this transistor. Although the effect is small for each programming operation, the cumulative effect for a very large and very dense memory array can be sufficiently large to raise the transistor's threshold voltage $V_T$ so that it reads like a programmed cell. This is an unsatisfactory condition, and is found in the memory arrays 100 and 200.

Figure 8:
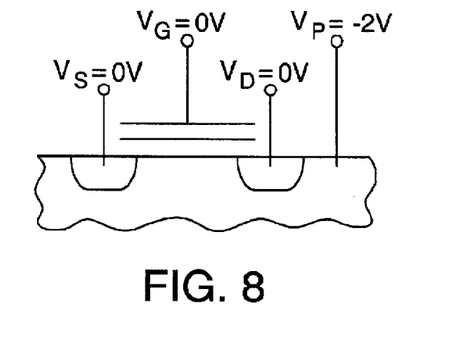

FIG. 8 shows illustrative voltages on a non-selected memory transistor that shares a bit line with a selected memory transistor that is not being programmed: the gate voltage $V_G$=0V, the source voltage $V_S$=0V, the drain voltage $V_D$=0V and the p-well substrate voltage $V_P$=-2V. No channel current flows, and no channel hot electrons or secondary hot electrons are generated. This is a satisfactory condition.

The unsatisfactory condition illustrated in FIG. 7 is improved by placing a negative bias on the gates of at least the unselected transistors having differential voltages on their sources and drains. An illustrative value is about minus 2 volts, although the precise voltage depends on the type of memory transistor and its specific characteristics. The various sets of illustrative voltages that result are shown in FIG. 9 and FIG. 10.

Figure 9:
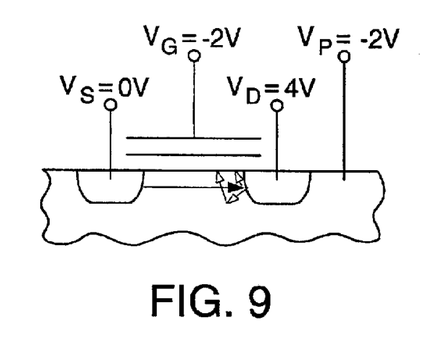

FIG. 9 shows illustrative improved voltages on a non-selected memory transistor that shares a bit line with a selected memory transistor that is being programmed: the gate bias voltage $V_G$=-2V, the source voltage $V_S$=0V, the drain voltage $V_D$=4V, and the p-well substrate voltage $V_P$=-2V. Some majority carrier flow exists in the channel, as indicated by the arrow with the black arrowhead. Channel hot electrons and secondary hot electrons are generated, as indicated by the arrows with the white arrowheads. However, since the control gate is at a negative bias, it repels the hot electrons and relatively few become injected into the floating gate. The erased state of this transistor is not significantly disturbed, even if the transistor remains unselected for a great number of programming operations common for a very large and very dense memory array. This is a satisfactory condition.

Figure 10:
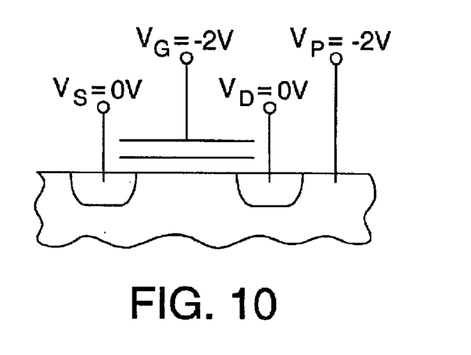

FIG. 10 shows illustrative improved voltages on a non-selected memory transistor that shares a bit line with a selected memory transistor that is not being programmed: the gate bias voltage $V_G$=-2V, the source voltage $V_S$=0V, the drain voltage $V_D$=0V, and the p-well substrate voltage $V_P$=-2V. No channel current flows, and no channel hot electrons or secondary hot electrons are generated. The negative bias on the gate has no adverse effect. This is a satisfactory condition.

Figure 15:
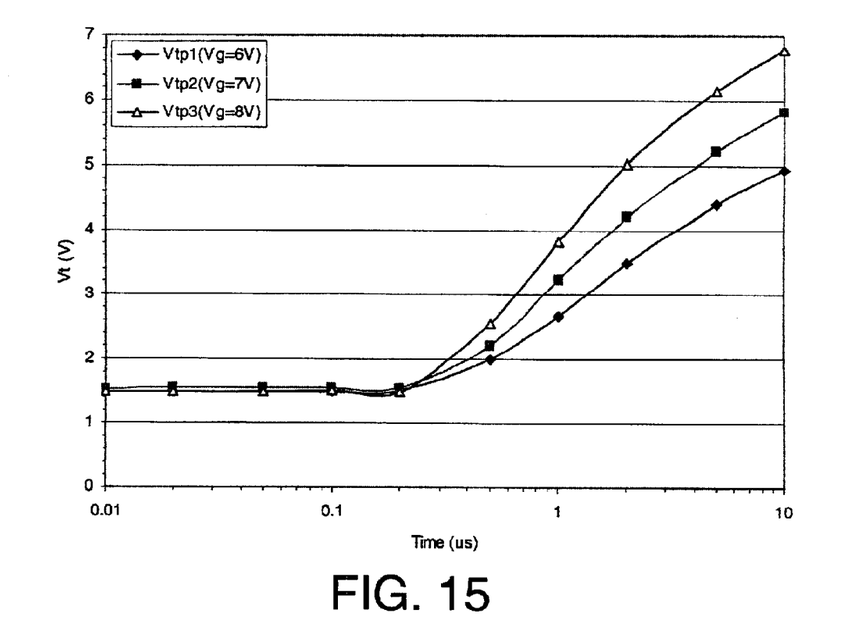
FIGS. 15 and 16 are graphs showing programming time for a halo-implanted stacked gate transistor using CISEI programming.
Figure 16:
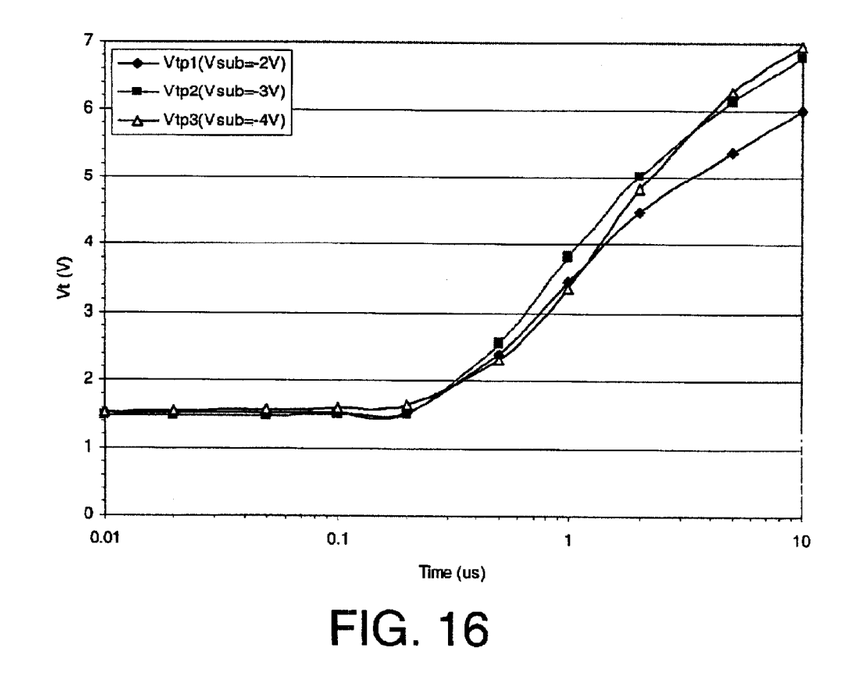
Figure 17:
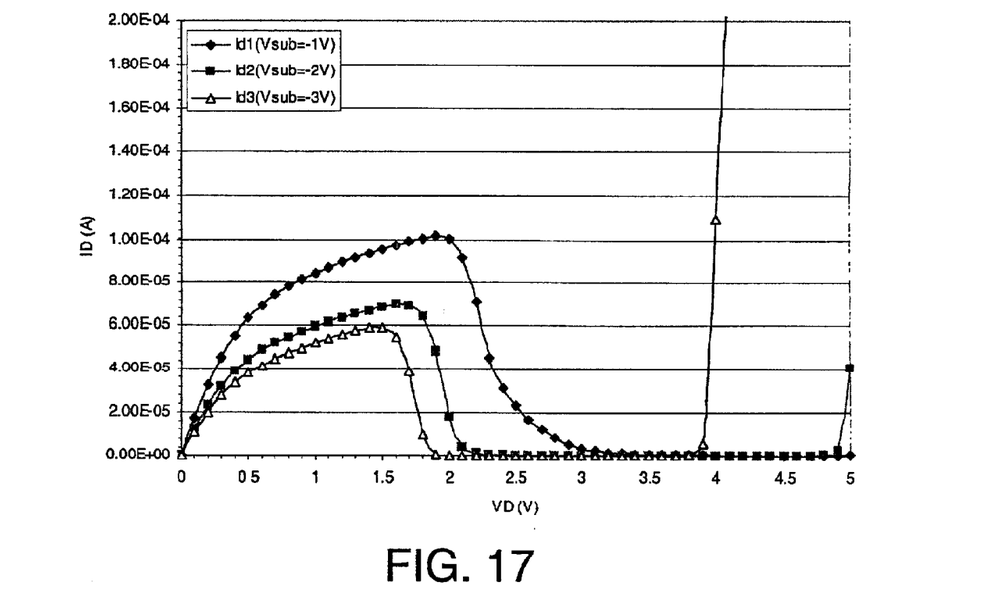
FIGS. 17–19 are graphs showing programming current for a halo-implanted stacked gate transistor using CISEI programming.
Figure 18:
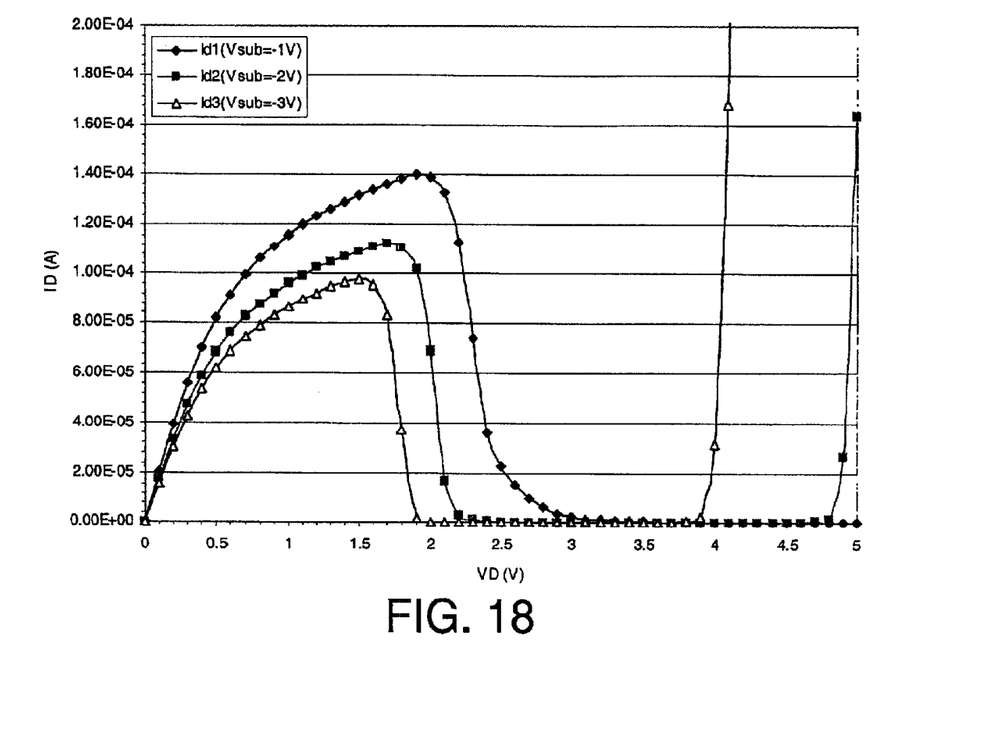
Figure 19:
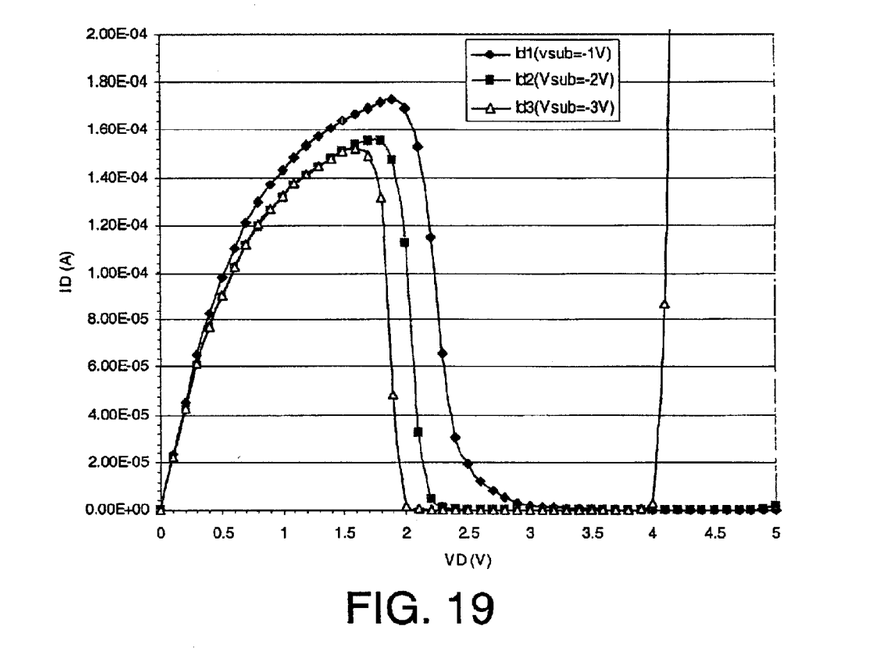

Exemplary program characteristics are shown in FIGS. 15 and 16. FIG. 15 is a graph of threshold voltage vs. time that shows program speed with different values of $V_G$ (points corresponding to $V_G$=6V are marked by the symbol ◊, points corresponding to $V_G$=7V are marked by the symbol ¤, and points corresponding to $V_G$=8V are marked by the symbol Δ), and indicates that cells can be programmed to $V_T \geq 5.5V$ within about 10 $\mu$sec with $V_G$=7V, $V_D$=4V, and $V_P$=-3V. FIG. 16 is a graph of threshold voltage vs. time that shows program speed with different values of $V_P$ (points corresponding to $V_P$=-2V are marked by the symbol ◊, points corresponding to $V_P$=-3V are marked by the symbol ¤, and points corresponding to $V_P$=4V are marked by the symbol Δ), and indicates that cells can be programmed to $V_T \geq 5.5V$ within about 10 $\mu$sec with $V_G$=8V, $V_D$=4V, and $V_P$=-2V. FIGS. 17–19 are graphs of drain current vs. drain voltage, and shows program current with different values of $V_P$ (points corresponding to $V_P$=-1V are marked by the symbol ◊, points corresponding to $V_P$=-2V are marked by the symbol ¤, and points corresponding to $V_P$=-3V are marked by the symbol Δ) for fixed $V_G$ of 6V (FIG. 17), 7V (FIG. 18), and 8V (FIG. 19). With $V_G$=7V and $V_P$=-2V, a program current of about 110 $\mu$A is achievable. Hence, for flash memory with 8 bits per byte, the simultaneous programming of all of the bits of up to 4 bytes is feasible, requiring less than about 4 mA of programming current. However, depending on the fabrication process, even less programming current per cell is achievable, permitting either a lower total programming current or the simultaneous programming of even bytes. The one page programming time for a low density part of about 16 MB having a page size of 1024 bits is about 320 msec, while the one page programming time for a high density part of about 32 MB having a page size of 2048 bits is about 640 msec.

Figure 20:
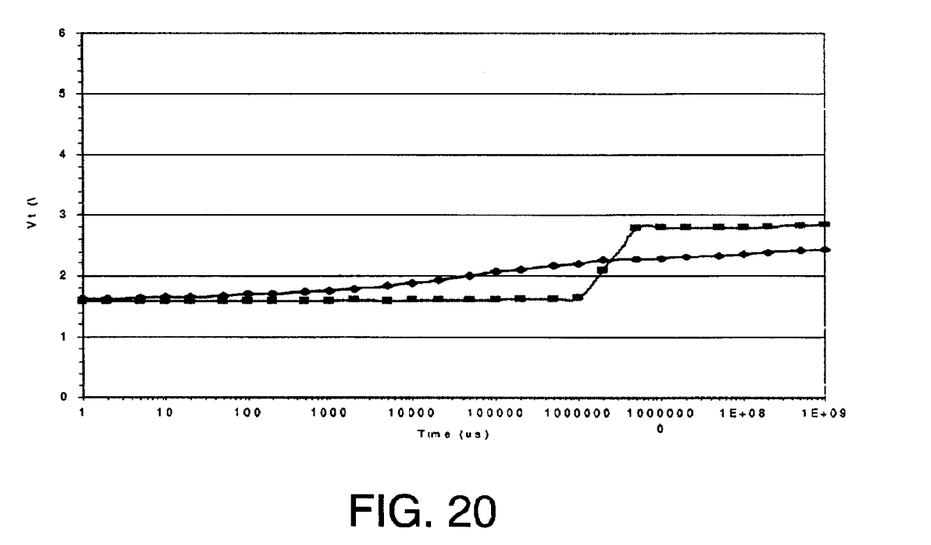
FIG. 20 is a graph comparing various program disturb characteristics for a halo-implanted stacked gate transistor using CISEI programming.

FIG. 20 is a graph of threshold voltage vs. time that shows bit line disturb for an erased cell with different values of $V_G$ (points corresponding to $V_G=-1.5V$ are marked by the symbol ◇, points corresponding to $V_G=0V$ are marked by the symbol ⌘) for fixed $V_D=4V$, $V_P=-3V$, and $V_S$ floating, and shows significant improvement in the disturb characteristics by using $V_G=-1.5V$ instead of $V_G=0V$. The curve for $V_G=-2V$ (not shown) is expected to be even flatter than the curve for $V_G=-1.5V$.

It will be appreciated that the time required for programming a page of a serial flash memory using CISEI programming is improved over the time required for programming a page of a serial flash memory using FN programming, which typically is on the order of about 5 ms and could be 7 ms and greater. The amount of some supporting circuitry is also reduced. A serial flash memory using FN programming requires a page of bit latches to store an entire page of data while the page of memory is being programmed. In contrast, flash memory using CHE programming requires only 32 bit latches to store the data while each successive group of 4 bytes in the page is being programmed.

Figure 11:
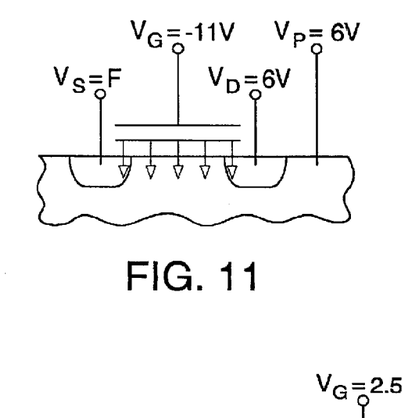
FIGS. 11–13 are cross-section drawings of an EEPROM cell suitable for CISEI programming, as exposed to various Fowler-Nordheim erasure bias voltages.
Figure 12:
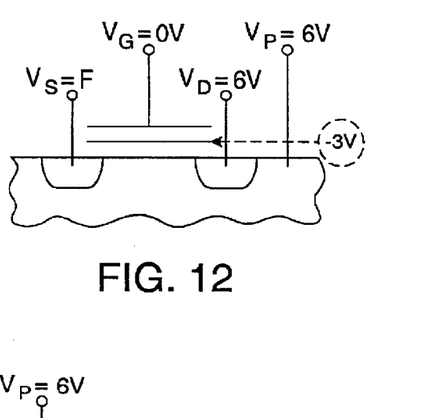
Figure 13:
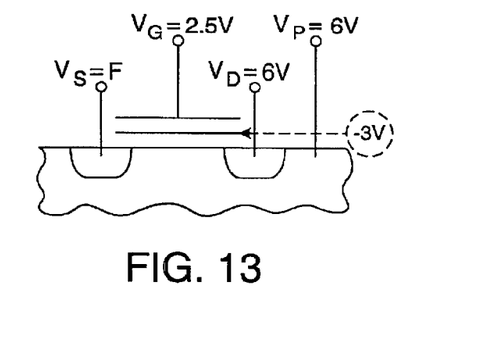

We have also found that the relatively thin tunnel oxide commonly found in the stacked gate type of flash memory transistor, including the type that is programmed using channel hot electron injection as well as the type that is programmed using channel-initiated secondary electron injection as disclosed in, for example, U.S. Pat. No. 5,659,504, which issued Aug. 19, 1997 (Bude et al., "Method and Apparatus for Hot Carrier Injection") and is incorporated herein by reference in its entirety, suffers a shortened lifetime because of the high fields that occur across the tunnel oxide during the FN erase operations. Memory cells in memory arrays such as the arrays 100 and 200 are impressed with three different sets of voltages during erase operations, one set being impressed on all of the selected cells and the other two sets being impressed on unselected cells depending on their location in the memory array. These various sets of voltages are illustrated in FIG. 11, FIG. 12 and FIG. 13 for a cell of the NOR memory array 100, but are applicable in principle to other types of arrays such as the virtual ground array 200. It also will be appreciated that the voltage levels depend on not only the type of memory cell, but also specific characteristics of the stacked gate memory cell and the application.

FIG. 11 shows illustrative voltages on a selected memory transistor that is being erased: the gate voltage $V_G=-11V$, the drain voltage $V_D=6V$, the p-well substrate voltage $V_P=6V$, and the n-well substrate voltage is 6V. The source voltage $V_S$ is left floating. Alternatively, the source voltage $V_S$ may be set to 6V and the drain voltage $V_D$ left floating, or both the source voltage $V_S$ and the drain voltage $V_D$ may be set to 6V. Electrons move by FN tunneling from the floating gate through the oxide to the channel and drain regions, thereby decreasing the VT of the transistor. The electron tunneling, which is generally parallel to the direction of the electrical field, is indicated by the arrows in FIG. 11. This is a satisfactory condition.

FIG. 12 shows illustrative voltages on a non-selected memory transistor: the gate voltage $V_G=0V$, the drain voltage $V_D=6V$, the p-well substrate voltage $V_P=6V$, and the n-well substrate voltage is 6V. The voltage difference between the channel/drain and the gate is insufficient to support FN tunneling. When the transistor is in an unprogrammed state, which is to say that the floating gate typically contains relatively few electrons, the electric field across the tunnel oxide is modest and does relatively little harm to the tunnel oxide, even if the memory undergoes many erase operations but the transistor itself is not erased. However, when the transistor is in a programmed state, which is to say that the floating gate contains many electrons and is highly charged, the electric field across the tunnel oxide is quite high. For example, for the stacked gate transistor of FIG. 1 holding a full charge, the voltage on the floating gate may be as greatly negative as minus 3 volts. The cumulative effect for a very large and very dense memory array can be sufficient, leading to degradation of the tunnel oxide. This is an unsatisfactory condition, which we refer to as erase disturb.

The unsatisfactory condition when the transistor is in a programmed or high $V_T$ state is improved by placing a positive bias on the gates of the unselected transistors in the memory array during erase operations. An illustrative value is about 2.5 volts to about 3 volts, that is $V_{CC}$, although the precise voltage depends on the type of memory transistor and its specific characteristics. The various set of voltages that results is illustrated in FIG. 13.

FIG. 13 shows illustrative voltages on a non-selected memory transistor having a positive gate bias: the gate bias voltage $V_G=2.5V$, the drain voltage $V_D=6V$, the p-well substrate voltage $V_P=6V$, and the n-well substrate voltage is 6V. The voltage difference between the channel/drain and the gate remains insufficient to support FN tunneling. When the transistor is in an unprogrammed state, the electric field across the tunnel oxide is even smaller than in the FIG. 12 arrangement. When the transistor is in a programmed state, the electric field across the tunnel oxide is reduced by 2.5 volts, thereby bring it down to a lower field strength so that the cumulative effect for a very large and very dense memory array is acceptable. This is a satisfactory condition.

Figure 21:
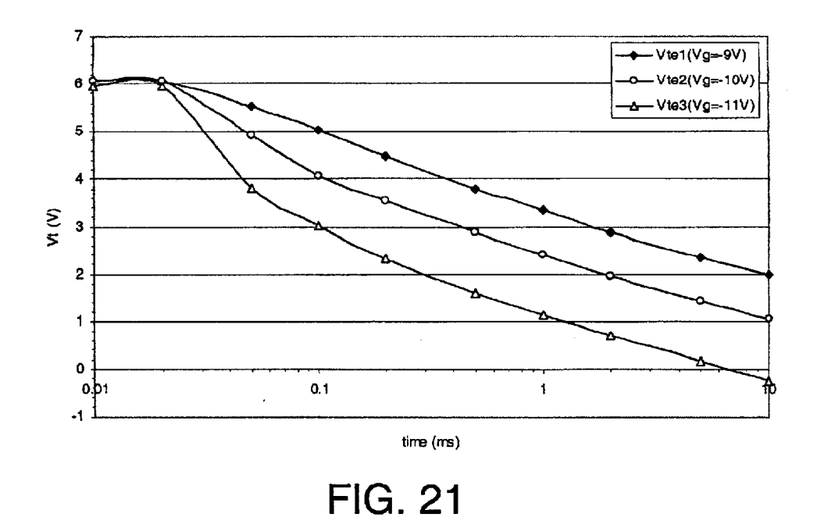
FIG. 21 is a graph showing erase time for a halo-implanted stacked gate transistor using FN tunneling for erasure.
Figure 22:
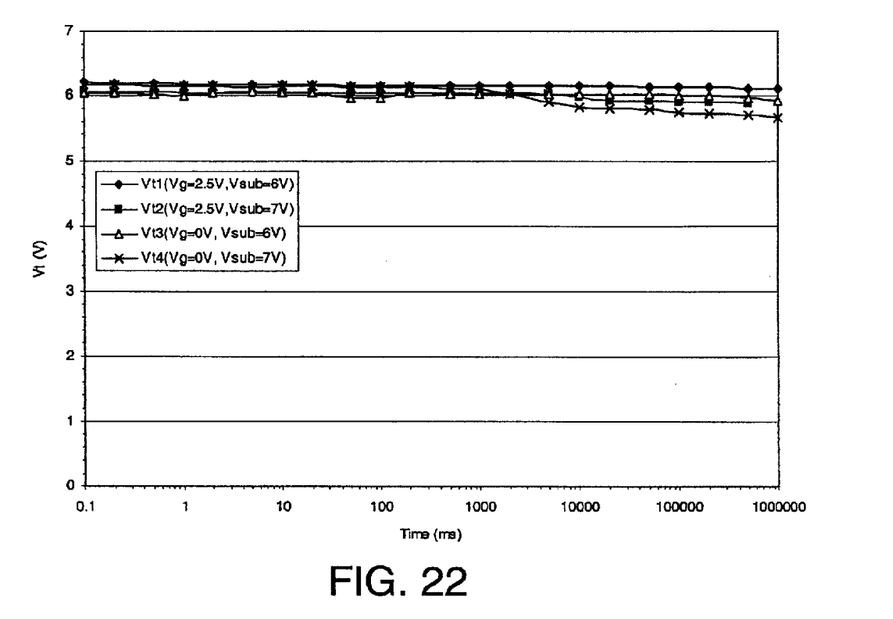
FIG. 22 is a graph comparing various erase disturb characteristics for a halo-implanted stacked gate transistor using FN tunneling for erasure.

Exemplary erase characteristics are shown in FIG. 21, which is a graph of threshold voltage vs. time, for a stacked gate cell having a halo implant. Specifically, FIG. 21 shows erase speed for different values of $V_G$ (points corresponding to $V_G=-9V$ are marked by the symbol ◇, points corresponding to $V_G=-10V$ are marked by the symbol ⌘, and points corresponding to $V_G=-11V$ are marked by the symbol Δ), with $V_D=6V$ and $V_P=6V$ and with the n-well substrate voltage at 6V. With $V_G=-11V$, cells are erased to $V_T \leq 2V$ within about 300 μsec to about 500 μsec. FIG. 22 is a graph of threshold voltage vs. time, and shows the amount of erase disturb for four combinations: $V_G=2.5V$ and $V_D=V_S=V_P=6V$ (corresponding points marked by the symbol ◇); $V_G=2.5V$ and $V_D=V_S=V_P=7V$ (corresponding points marked by the symbol ⌘); $V_G=0V$ and $V_D=V_S=V_P=6V$ (corresponding points marked by the symbol Δ); and $V_G=0V$ and $V_{D=VS}=V_P=7V$ (corresponding points marked by the symbol X). The threshold voltage is seen to be essentially unchanged when using $V_G=2.5V$ instead of $V_G=0V$ during erase operations. FIGS. 21 and 22 are illustrative both of cells designed for CISEI programming as well as cells designed for CHE programming.

The counter biasing techniques described herein is not limited to the specific memory array architecture of FIGS. 3 and 4, but may be used in any array architecture, including virtual ground flash memory, NAND, NOR, and so forth, in which the individual unselected memory cells are subject to either voltage disturb during programming or to high electric fields across the tunnel oxide during erase.

The stacked gate transistor is read using any suitable technique and any suitable set of voltages, including page mode and single and multiple byte reading. Illustratively, the stacked gate transistor of FIG. 1 is designed to have a low $V_T$ of about 2.0V or even about 1.5V, and a high $V_T$ of about 5.5V, although the precise voltage depends on the type of memory transistor and its specific characteristics.

To avoid any tendency for any memory cells in memory arrays such as the arrays 100 and 200 to experience read disturb due to hot electrons including channel-induced secondary electron injection, which is similar to program disturb but on a smaller scale, a negative bias is placed on the gates of the transistors in the memory array that are not selected for reading. An illustrative value is about minus 2 volts, although the precise voltage depends on the type of memory transistor and its specific characteristics.

Figure 14:
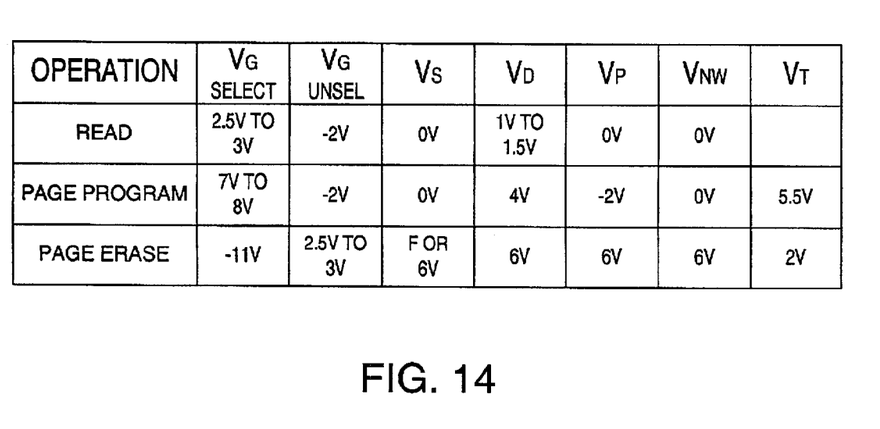
FIG. 14 is a table showing various CISEI bias voltages suitable for application to the memory cells of the memory arrays of FIGS. 3 and 4.

The illustrative set of voltages described above are summarized in the table shown in FIG. 14, which also includes illustrative voltages suitable for the memory array 200. The substrate n-well voltage $V_{NW}$ is also shown. It will be appreciated that the particular voltages and voltage ranges set forth are illustrative and that satisfactory voltages different than the voltages and voltage ranges set forth in the table may be used. These voltages and variations thereof are generated and applied to the memory array using voltage multipliers and voltage dividers in a manner well know in the art.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. These and other variations and modifications of the embodiments disclosed herein may be made without departing from the scope and spirit of the invention.

What is claimed is:

1. A method of programming a memory array that comprises a plurality of memory cells coupled to a plurality of word select lines, each of the memory cells having an adjustable threshold voltage and a gate overlying a channel and being programmable using channel-initiated secondary electron injection, the method comprising:

applying a first negative voltage to the channels;

generating channel-initiated secondary hot electrons in the channels of at least a first and a second of the memory cells;

applying a second voltage to the gate of the first memory cell, the second voltage having a polarity and magnitude relative to the first voltage sufficient to attract the hot electrons and change the threshold voltage of the first memory cell to a programmed state; and applying a third voltage to the gate of the second memory cell, the third voltage having a polarity and magnitude relative to the first voltage sufficient to repel the hot electrons and deter change in the threshold voltage of the second memory cell.

2. The method of claim 1 wherein:

the memory cells comprise stacked gate memory cells; and the first voltage is about −2 volts, the second voltage is in a range of from about 7 volts to about 8 volts, and the third voltage is about −2 volts.

3. The method of claim 1 wherein the generating step comprises applying a fourth voltage and a fifth voltage to, respectively, source and drain regions defining the channels of the first and second memory cells, the fourth voltage being applied through a common ground line and the fifth voltage being applied through a bit line.

4. The method of claim 3 wherein:

the memory cells comprise stacked gate memory cells; and the first voltage is about −2 volts, the second voltage is in a range of about 7 volts to about 8 volts, the third voltage is about −2 volts, the fourth voltage is about 0 volts, and the fifth voltage is about 4 volts.

5. The method of claim 1 wherein the generating step comprises applying a fourth voltage and a fifth voltage to, respectively, source and drain regions defining the channels of the first and second memory cells, the fourth voltage being applied through a virtual ground line and the fifth voltage being applied through a bit line.

6. The method of claim 5 wherein:

the memory cells comprise stacked gate memory cells; and the first voltage is about −2 volts, the second voltage is in a range of about 7 volts to about 8 volts, the third voltage is about −2 volts, the fourth voltage is about 0 volts, and the fifth voltage is about 4 volts.

7. A memory comprising:

a memory array having a plurality of memory cells coupled to a plurality of word select lines, each of the memory cells having an adjustable threshold voltage and a gate overlying a channel and being programmable using channel-initiated secondary electron injection;

a voltage source for applying a first negative voltage to the channels;

a voltage source for establishing a voltage differential across the respective channels of at least a first and a second of the memory cells, the potential differential being sufficient to generate channel-initiated secondary hot electrons in the respective channels thereof;

a voltage source for applying a second voltage to the gate of the first memory cell, the second voltage having a polarity and magnitude relative to the first voltage sufficient to attract the hot electrons and change the threshold voltage of the first memory cell to a programmed state; and a voltage source for applying a third voltage to the gate of the second memory cell, the third voltage having a polarity and magnitude relative to the first voltage sufficient to repel the hot electrons and deter change in the threshold voltage of the second memory cell.

8. A NOR-type memory integrated circuit comprising:

a plurality of word select lines;

a plurality of bit lines;

a plurality of source lines;

a memory array having a plurality of adjustable threshold voltage memory transistors, each being programmable using channel-initiated secondary electron injection and having a source coupled to one of the source lines, a drain coupled to one of the bit lines, a floating gate overlying a channel defined in a substrate body region between the source and the drain, and a control gate overlying the floating gate and coupled to one of the word select lines;

a voltage source for applying a body voltage to the substrate body regions containing the channels;

a voltage source for applying a source voltage to the sources of at least a first and a second of the memory transistors via a common one of the source lines;

a voltage source for applying a drain programming voltage to the drains of the first and second memory transistors via a common one of the column lines, the source and drain programming voltages being sufficient to generate channel-initialed secondary hot electrons in the respective channels of the first and second memory transistors;

a voltage source for applying a select voltage to the gate of the first memory transistor via a first one of the word select lines, the select voltage having a polarity and magnitude relative to the body voltage sufficient to attract the hot electrons of the first memory transistor and change the threshold voltage thereof to a programmed state; and a voltage source for applying an unselect voltage to the gate of the second memory cell via a second one of the word select lines, the unselect voltage having a polarity and magnitude relative to the first voltage sufficient to repel the hot electrons of the second memory transistor and deter change in the threshold voltage thereof.

9. The memory integrated circuit of claim 8 wherein:

the body voltage is about −2 volts;

the source voltage is about 0 volts;

the drain programming voltage is about 4 volts;

the select voltage is in a range of from about 7 volts to about 8 volts; and the unselect voltage is about −2 volts.

10. A virtual ground-type memory integrated circuit comprising:

a plurality of word select lines;

a plurality of column lines;

a memory array having a plurality of adjustable threshold voltage memory transistors, each being programmable using channel-initiated secondary electron injection and having a source coupled to one of the column lines, a drain coupled to an adjacent one of the column lines, a floating gate overlying a channel defined in a substrate body region between the source and the drain, and a control gate overlying the floating gate and coupled to one of the word select lines;

a voltage source for applying a body voltage to the substrate body regions containing the channels;

a voltage source the applying a reference voltage to the sources of at least a first and a second of the memory transistors via a first one of the column lines;

a voltage source for applying a programming voltage to the drains of the first and second memory transistors via a second one of the column lines adjacent the first column line, the reference and programming voltages being sufficient to generate channel-initiated secondary hot electrons in the respective channels of the first and second memory transistors;

a voltage source for applying a select voltage to the gate of the first memory transistor via a first one of the word select lines, the select voltage having a polarity and magnitude relative to the body voltage sufficient to attract the hot electrons of the first memory transistor and change the threshold voltage thereof to a programmed state; and a voltage source for applying an unselect voltage to the gate of the second memory cell via a second one of the word select lines, the unselect voltage having a polarity and magnitude relative to the first voltage sufficient to repel the hot electrons of the second memory transistor and deter change in the threshold voltage thereof.

11. The memory integrated circuit of claim 10 wherein:

the body voltage is about −2 volts;

the reference voltage is about 0 volts;

the programming voltage is about 4 volts;

the select voltage is in a range of from about 7 volts to about 8 volts; and the unselect voltage is about −2 volts.

\* \* \* \* \*